(12) United States Patent
Watzinger et al.

(10) Patent No.: US 11,434,976 B2
(45) Date of Patent: *Sep. 6, 2022

(54) LAYER OF HARD MATERIAL ON A METAL SUBSTRATE

(71) Applicant: IWIS Motorsysteme GmbH & CO. KG, Munich (DE)

(72) Inventors: Bernd Watzinger, Munich (DE); Matija Burger, Munich (DE)

(73) Assignee: IWIS Motorensysteme GmbH & Co. KG, Munich (DE)

( * ) Notice: Subject to any disclaimer, the term of this patent is extended or adjusted under 35 U.S.C. 154(b) by 0 days.

This patent is subject to a terminal disclaimer.

(21) Appl. No.: 16/970,153

(22) PCT Filed: Feb. 14, 2019

(86) PCT No.: PCT/EP2019/053748
§ 371 (c)(1),
(2) Date: Aug. 14, 2020

(87) PCT Pub. No.: WO2019/158669
PCT Pub. Date: Aug. 22, 2019

(65) Prior Publication Data
US 2021/0115567 A1    Apr. 22, 2021

(30) Foreign Application Priority Data
Feb. 14, 2018    (DE) .................... 10 2018 103 320.6

(51) Int. Cl.
*C23C 16/34*    (2006.01)
*F16G 13/06*    (2006.01)
(Continued)

(52) U.S. Cl.
CPC .............. *F16G 13/06* (2013.01); *C23C 16/32* (2013.01); *C23C 16/34* (2013.01); *C23C 16/36* (2013.01);
(Continued)

(58) Field of Classification Search
CPC ........ F16G 13/06; C23C 16/34; C23C 28/048
(Continued)

(56) References Cited

U.S. PATENT DOCUMENTS 9,457,407 B2 * 10/2016 Imamura ............... C23C 14/325
2014/0050932 A1    2/2014 Gierl et al.
(Continued)

FOREIGN PATENT DOCUMENTS

DE    37 25 321    4/1988
DE    103 15 166 A1    10/2003
(Continued)

OTHER PUBLICATIONS

International Search Report issued by the European Patent Office in International Application PCT/EP2019/053748 dated Apr. 9, 2019.

*Primary Examiner* — Archene A Turner
(74) *Attorney, Agent, or Firm* — Henry M. Feiereisen LLC

(57) ABSTRACT

A chain component of a chain for power transmission coated with a layer of hard material includes a substrate based on steel and a layer of hard material on an outer surface of the substrate based on steel, with the layer of hard material containing metal nitrides and the C mass concentration in the layer of hard material decreasing in the direction toward the outer surface of the layer of hard material.

16 Claims, 3 Drawing Sheets

(51) Int. Cl.
  *C23C 16/32* (2006.01)
  *C23C 28/04* (2006.01)
  *F16S 5/00* (2006.01)
  *C23C 16/36* (2006.01)

(52) U.S. Cl.
  CPC .......... *C23C 28/042* (2013.01); *C23C 28/044* (2013.01); *C23C 28/048* (2013.01); *F16S 5/00* (2013.01)

(58) Field of Classification Search
  USPC ........................................................ 428/698
  See application file for complete search history.

(56) References Cited

U.S. PATENT DOCUMENTS

| 2015/0111676 | A1  | 4/2015 | Nishikawa et al. |
| 2015/0211603 | A1  | 7/2015 | Koschig et al. |
| 2016/0153525 | A1* | 6/2016 | Eda .......................... C21D 1/18 |
|              |     |        | 474/228 |
| 2017/0058997 | A1* | 3/2017 | Asada ..................... C23C 10/08 |

FOREIGN PATENT DOCUMENTS

| DE | 103 16 484 A1 | 10/2003 |
| DE | 102005047449 | 9/2006 |
| DE | 102006052869 | 5/2008 |
| DE | 102011006294 | 10/2012 |
| DE | 102013222244 | 4/2015 |
| DE | 102016215709 | 3/2017 |
| EP | 2 868 947 | 5/2015 |
| WO | WO 2014/019699 | 2/2014 |
| WO | WO 2014/044420 | 3/2014 |

* cited by examiner

LAYER OF HARD MATERIAL ON A METAL SUBSTRATE

CROSS-REFERENCES TO RELATED APPLICATIONS

This application is the U.S. National Stage of International Application No. PCT/EP2019/053748, filed Feb. 14, 2019, which designated the United States and has been published as International Publication No. WO 2019/158669 A1 and which claims the priority of German Patent Application, Serial No. 10 2018 103 320.6, filed Feb. 14, 2018, pursuant to 35 U.S.C. 119(a)-(d).

BACKGROUND OF THE INVENTION

The Invention concerns a method for producing a metal component coated with a layer of hard material, comprising the processing steps of preparing a release agent, adding the prepared release agent to a powder mixture, preparing the powder mixture, preparing the metal substrate, heating the powder and the substrate in a heating device, depositing a layer on the substrate, with the layer having a greater hardness than the substrate, and cooling the substrate, as well as a metal component with a layer of hard material.

STATE OF THE ART

Sprocket chains with chain links connected to each other by chain joints are used in various ways. When used as drive or conveyor chains, the region of the chain joints is particularly subject to such a lot of stress that there is a need for a wear-resistant bearing surface. It is also expedient, particularly because of the large number of pieces, to replace expensive solutions to this problem with economical coating procedures and processes.

DE 10 2005 047 449 A1 proposes a more wear-resistant link chain, whose chain pins and/or chain bushings are provided with coatings of hard material. These coatings are applied by means of PVD (PVD: Physical Vapor Deposition). The layer of hard material has a thickness of 1 to 10 μm and can furthermore be covered by an anti-friction layer, e.g. PTFE.

Document DE 10 2006 052 869 A1 describes a link chain whose link surface of the pins and the bushing is provided with a PVD layer of hard material.

The pins and the bushing consist of steel having a high carbon content with a carbon content of between 0.4 wt. % and 1.2 wt. %.

DE 10 2011 006 294 A1 discloses a method for producing a hardened coated metal component. The surface layer of the metal component is heat treated for purposes of enriching the carbon and/or nitrogen content and is then quenched to a temperature below martensite formation. The metal component is then annealed at a higher temperature than the temperature at which the subsequent coating process takes place. The coating itself takes place by CVD or PVD methods (CVD: Chemical Vapor Deposition).

DE 10 2013 222 244 A1 describes a chain link for a chain provided with a friction-reducing tribological coating. The coating is applied by PVD or PACVD methods.

DE 10 2016 215 709 A1 shows chain components such as steel bushings, links, pins and coils, which are provided with a wear-reducing CrN layer. The CrN layer is produced by means of a CVD procedure. In this case the nitrogen is obtained from the steel that has been nitrated prior to the treatment.

A joint for a roller or a bush chain is disclosed in WO 2014019699 A1. A nitride or carbide layer of hard material is applied onto the joint by means of PVD or CVD procedures.

The aforesaid methods for producing a hardened coated metal component have disadvantages. PVD methods require a working pressure of 104 to 10 Pa and, depending on the nature of the coating, operate at temperatures of several hundreds of ° C. PVD procedures thus impose high demands on the coating chamber. They are additionally not applicable to bulk materials. The substrate and the material (target) that is to be deposited are spatially separated in the coating chamber. PVD procedures are so-called line of sight processes, i.e. only the surfaces visible from the target are coated. Inner surfaces or holes receive a thinner coating. On the other hand, powder methods have the problem that the diffusion of carbon into the layer of hard material leads to the formation of carbides. However, since nitrides and particularly chromium nitride promise significantly better operating lifetimes of the component with regard to wear, it is necessary to enhance the formation of nitrides, particularly in the regions near the surface. This requirement is in no way satisfied by the procedures proposed in the state of the art.

It is therefore the object of the present invention to make available a hardened nitride-coated metal component, which has a high quality and a long lifetime of the layer of hard material and can be made simply and economically in a mass production process, which makes it possible to perform the coating of a high number of items per unit of time economically.

SUMMARY OF THE INVENTION

This object of the invention is achieved by means a device as described hereinafter.

This object of the invention is achieved by means a device in accordance with claim 1.

The chain component according to the invention of a chain for power transmission is coated with a layer of a hard material. The chain component has a substrate based on steel as well as a layer of hard material on the exterior of the substrate. The layer of hard material is made to contain metal nitrides. According to the invention, the mass concentration of carbon (C) in the layer of hard material decreases, particularly toward for the outside of the layer of hard material.

It is by means of CVD coating that a hard layer of carbon-containing steel is deposited on the substrate, which layer has a high abrasion resistance and wear resistance, high hardness and temperature stability, low friction as well as good chemical properties and a low tendency to adhere. Aside from the enhancement of the wear resistance, the layer of hard material also increases the corrosion resistance. Carbon-containing steels can be suitable as substrates, since these steels have sufficient strength and good temper resistance. The layer of hard material can consist of both metallic and non-metallic hard materials. Suitable metallic hard materials are all carbides, nitrides, carbonitrides, borides and silicides of transition metals, e.g. chromium, tungsten, zirconium, titanium. Suitable non-metallic hard materials are e.g. diamond and DLC (Diamond Like Carbon) as well as corundum, boron carbide, cubic boron nitride, silicon carbide or aluminum nitride. Metallic nitride formers, in particular chromium nitride (CrN), have been found to be suitable for directly coating the surfaces of substrates of steel having a high carbon content. Chromium nitride has several advantages compared with other metallic and non-metallic hard materials. Chromium nitride can additionally be deposited by means of CVD and, with good adhesion to the substrate, produces a thin layer of hard material having a high abrasion resistance at a thickness of at least 1 to 5 µm. The CVD procedure offers advantages in comparison with PVD procedures regarding the production of a layer of hard material. The CVD procedure, as opposed to the PVD procedure, is applicable to bulk materials and offers economic advantages regarding equipment technology, servicing and process technology: The substrate to be coated is e.g. coated with nitrogen-containing powders in a rotary drum. The coating process takes place over several hours at a certain processing temperature and at ambient pressure. All accessible surfaces of the substrate, including narrow bores, are coated evenly. The coated substrate is cooled down at the end the coating process. In the case of the PVD procedure, the substrate and the material to be deposited are disadvantageously spatially separated, the coating is performed by evaporation of the material to be deposited at operating pressures of $10^{-4}$ to 10 Pa.

The layer of hard material is formed so that it essentially consists of CrN. It has an outward side (outer surface) on the surface of the component and an inward side that is in contact with the substrate. When carbon-containing steel is used as the substrate, the carbon diffuses from the steel into the layer of hard material at the high processing temperatures and forms CrNC and/or CrC.

The layer of hard material is advantageously formed so that the C mass concentration on the outer surface of the layer of hard material is smaller than that in the interior. This clearly increases the wear resistance and thus the lifetime of the chain component according to the invention. The layer of hard material furthermore clearly has higher metal nitride content toward its exterior, which leads to an improvement of the wear resistance as compared to a layer of hard material made of metal carbides.

Further embodiments of the invention regarding a sensor device are described in the subsidiary claims.

In a further embodiment of the invention, the mass concentration of nitrogen at the outer surface of the layer of hard material is greater than the mass concentration of carbon. In a preferred further embodiment, the ratio of the mass concentrations of nitrogen to that of carbon is greater than 3:1, most preferably greater than 5:1.

In a further embodiment of the invention, the C mass concentration in the layer of hard material in a region near the substrate increases toward the outside of the layer of hard material. It is through the diffusion of carbon toward the existing substrate consisting of carbon-containing steel that carbon accumulates at the surface of the substrate. The C mass concentration of the layer of hard material therefore increases near the surface of the substrate.

In a further embodiment of the invention, the C mass concentration reaches a maximum in the layer of hard material. It is through diffusion of carbon toward the surface of the substrate consisting of carbon-containing steel that carbon accumulates at the surface of the substrate. The C mass concentration of the layer of hard material is therefore at a maximum near the surface of the substrate.

In a further embodiment of the invention, the distance of the maximum of the C mass concentration in the layer of hard material from the outer surface of the layer of hard material is smaller than the distance of the maximum of the C mass concentration in the layer of hard material from the border between the layer of hard material and the substrate. It is through diffusion of carbon to the surface of the substrate consisting of carbon-containing steel that carbon accumulates at the surface of the substrate. The maximum of the C mass concentration in the layer of hard material is therefore near the substrate.

In a further embodiment of the invention, the amount by which the increase of the C mass concentration in the layer of hard material increases in a region near the substrate is higher than the amount by which it increases in a region of decreasing C mass concentration. The C mass concentration rises steeply in a region near the substrate. A large portion of the carbon of the layer of hard material is consequently bound at a considerable depth of the layer of hard material.

In a further embodiment of the invention, the mass concentration of nitrogen (N) in the layer of hard material increases toward the exterior of the layer of hard material. The outer surface of the layer of hard material thus has a higher CrN content than deeper regions.

In a further embodiment of the invention, the increase of the N mass concentration in the layer of hard material within a region close to the substrate is greater than the increase within a region close to the outer surface of the layer of hard material. The N mass concentration of the layer of hard material therefore reaches a maximum near the surface of the substrate.

In a further embodiment of the invention, the average N mass concentration in the layer of hard material is greater than the average C mass concentration in the layer of hard material. To obtain a CrN layer of hard material that is as homogeneous as possible, it is advantageously possible to increase the N mass concentration by way of suitable processing parameters, e.g. via nitration of the substrate and/or through the use of a nitrogen-containing powder.

In a further embodiment of the invention, the average N mass concentration in the layer of hard material is higher by a factor of 2, preferably a factor of 3 and particularly preferably a factor of 4 than the average C mass concentration in the layer of hard material. This embodiment ensures that the layer of hard material largely consists of CrN.

In a further embodiment of the invention, the average N mass concentration in the region near the surface of the layer of hard material is greater at every depth than the average C mass concentration in the layer of hard material. At greater depths of the layer of hard material near the substrate, the carbon of the substrate consisting of carbon-containing steel accumulates. This carbon enrichment leads to the formation of carbides, primarily iron and chromium carbides. The region near the surface has a depth amounting to 50% of the layer thickness, preferably 65% of the layer thickness and particularly preferably to 80% of the layer thickness.

In a further embodiment of the invention, the average mass concentration of chromium (Cr) in the layer of hard material is greater than the average mass concentration of iron (Fe) in the layer of hard material. Cr is primarily built into the layer of hard material by means of the coating process, e.g. by way of a powder that contains Cr, Fe during the CVD process. The Fe present in the layer of hard material improves the adhesion properties of the layer of hard material to the substrate and prevents flaking.

In a further embodiment of the invention, the average Cr mass concentration in the layer of hard material is greater by a factor of 2, preferably by a factor of 4 and particularly preferably by a factor of 6 than the average Fe mass concentration in the layer of hard material. Small quantities of Fe in the layer of hard material and/or the diffusion layer suffice to improve the adhesion of the layer of hard material to the substrate.

In a further embodiment of the invention, the average Cr mass concentration in the region near the surface of the layer of hard material is greater at every depth than the average Fe mass concentration in the layer of hard material. At greater depths near the substrate of the layer of hard material, the Fe content of the substrate consisting of steel increases. The region near the surface has a depth of up to 50% of the layer thickness, preferably 65% of the layer thickness and particularly preferably 80% of the layer thickness.

BRIEF DESCRIPTION OF THE DRAWING

Example embodiments of the sensor according to the invention and of the method of the invention are shown in a schematically simplified way in the drawings and are described in greater detail in the subsequent description.

The drawings show.

DETAILED DESCRIPTION OF PREFERRED EMBODIMENTS

Figure 1:
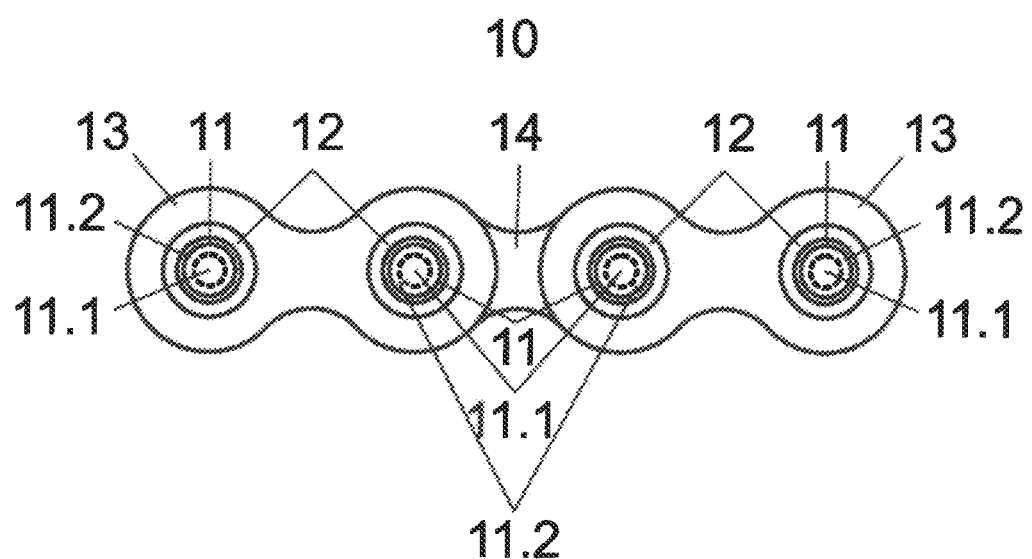
FIG. 1 a chain with components coated with a hard material.

FIG. 1 shows two chain links of a chain 10, which can e.g. be used in chain drives. The chain 10 is configured as a bush chain with inner links and outer links respectively interconnected via a chain link. The inner chain link consists of two respective inner flaps 13 running in parallel and two bushings 12 connecting the inner flaps 13 to each other, with the bushings 12 perpendicular to the flaps 13.

The outer chain links 14 consist of two parallel outer flaps 14, which are connected to each other by two pins 11, with the pins 11 disposed in the bushings 12 of the inner chain links 13 so that they are rotatable. The outer chain link 14 is fastened in a rotatable manner to an adjacent inner chain link 13 by the pin 11 and connects the inner chain link 13 with a second inner chain link 13 by way of the outer flaps 14, with the outer flaps 14 running parallel to the inner flaps 13. The pins 11 of the outer chain link 14 are disposed in a rotatable manner in the bushings 12 of the inner chain link 13, with each connection constituting a chain link of the chain 10. The pins 11 of the chain 10 consist entirely of a carbon-containing steel, with the joint surface of the pin 11 being provided with a CrN layer of hard material deposited by way of a CVD process. The bushing 12 can alternatively or additionally also be made of a carbon-containing material and can be provided with a CVD layer of a hard material on its joint surface and/or on the bearing surface.

The following presents two concentration profiles of two different chain components according to the invention, which have respectively been coated with a layer of hard material by means of CVD processes. The specimens are pins 11 made of a nitrated steel 40CrMoV13-9. The layers consist of chromium nitrides and carbides with layer thicknesses of about 10 µm. The concentration profiles of the two samples were determined by Glow Discharge Optical Emission Spectroscopy (GD-OES). This procedure uses the metal samples as cathodes in a DC plasma. Starting with the surface, the sample is steadily removed from the surface in layers by cathodic sputtering with argon ions. The removed atoms get into the plasma by diffusion. Upon being excited by means of collision processes, they emit photons with characteristic wavelengths, which are recorded by an attached spectrometer and then quantified.

Figure 2:
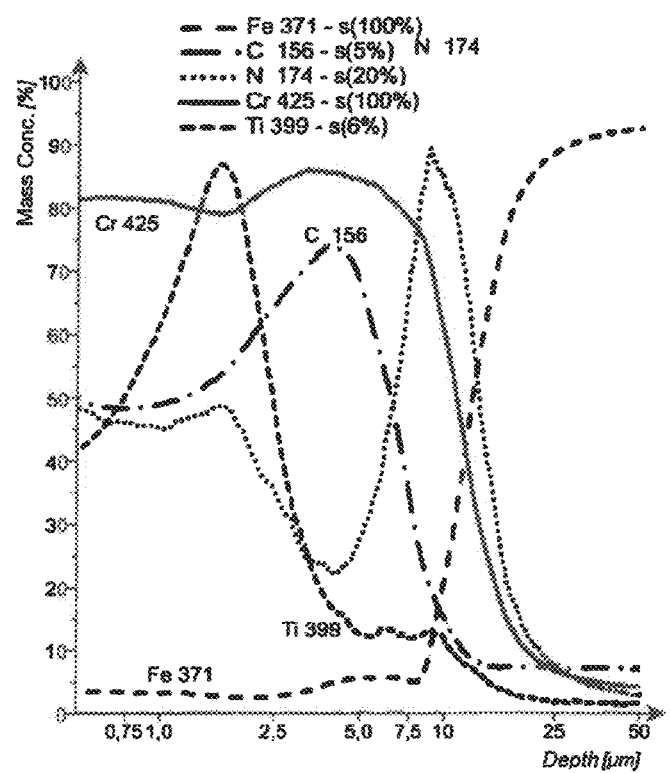
FIG. 2 a depth profile analysis of the sample 1 for the elements Fe, Cr, N and C, FIG. 3 a depth profile analysis of the sample 2 for the elements Fe, Cr, N and C.

FIG. 2 shows the concentration profile of sample 1. During the separation process, the sample was first heated from 0 to 960° C. for about 1 h. The hold time amounted to 6 h and the sample was then slowly cooled down to 200° C. (for about 10 h). The reactor was flushed with nitrogen during the process. The horizontal axis shows the depth on a logarithmic scale for better visualization. The vertical axis shows the mass concentration, also with relative scaling for reasons of clarity. 100% on the vertical axis corresponds to a 100% mass concentration of the elements Fe and Cr, of 20% N as well as of 5% C.

The Fe mass concentration in the range of 0 to 7.5 µm is constantly close to 0%. The Fe mass concentration rises to 5% as of 8 µm. Within the region at a greater depth than 10 µm, the Fe mass concentration increases steeply to 90% up to a depth of 27 µm. As of a depth greater than 27 µm, the Fe mass concentration rises constantly with a lower gradient to 92% at 50 µm.

The Cr mass concentration in the region of 0 to 7.5 µm rises constantly from 86% at 0 µm to 88% at 7.5 µm. As of a depth of 7.5 µm, the Cr mass concentration decreases steeply to a value of 10% until a depth of 25 µm is reached. As of a depth of 25 µm, the Cr mass concentration drops to a value of 5% at a depth of 50 µm.

The N mass concentration is 10.8% at 0 µm and drops to a value of 6% at 7.5 µm. The decrease of the mass concentration is not constant; an increase of the N mass concentration to 9.4% is observed at a depth of 2.5 µm. As of a depth of 7.5 µm, the N mass concentration increases steeply to a maximum value of 15.6% at 10 µm. At a depth of 13 µm, the N mass concentration drops steeply to a value of 2% at 25 µm. The thickness of the layer therefore amounts to about 13 µm.

The C mass concentration has a value of 0.75% at 0 µm and increases to a value of 1.25% at 2.5 µm. As of a depth of 2.5 µm, the C mass concentration increases steeply to a maximum value of 2.75% at 8 µm. As of a depth of 8 µm, the C mass concentration drops steeply to a value of 0.5% at 25 µm.

An analysis of the progression of the mass concentrations of carbon and nitrogen shows that the mass concentration of nitrogen at the surface of the layer of hard material is greater than the mass concentration of carbon. The ratio is approx. 14:1 and is thus greater than 10:1.

Figure 3:
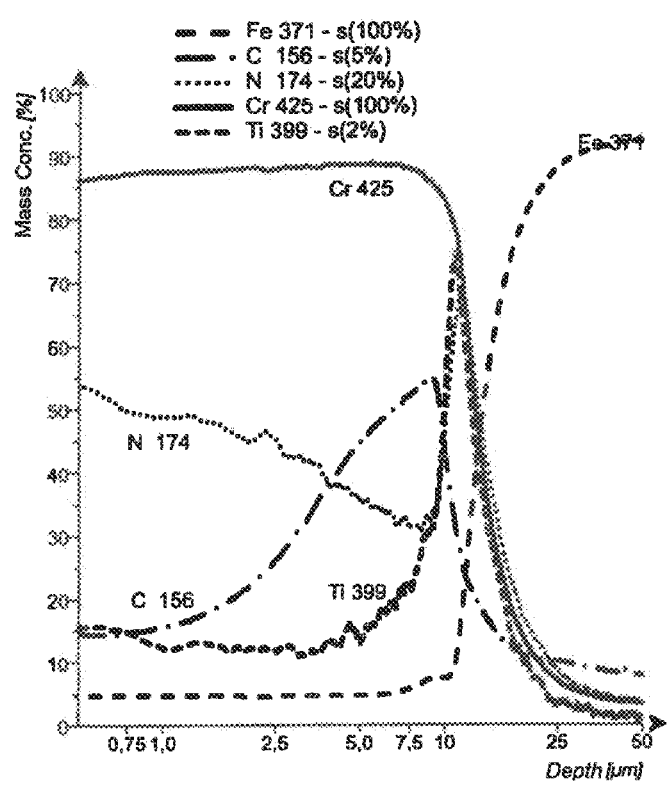

FIG. 3 shows the concentration profile of the sample 2 in which an intermediate layer essentially consisting of CrC was built into the layer of hard material. The sample was first heated to 950° C. for about 45 min during the separation process. The hold time amounted to 7 h and the sample was then slowly cooled to 200° C. (for about 10 h). The reactor was flushed with nitrogen during the process. As in FIG. 2, the horizontal axis shows the depth, also on a logarithmic scale. The vertical axis shows the mass concentration on a relative scale. 100% on the vertical axis corresponds to a 100% mass concentration of the elements Fe and Cr, of 20% N as well as of 5% C.

The Fe mass concentration is constant at 0% in the range of 0 to 3 µm. The Fe mass concentration increases to 5% as of 3 µm. In the region deeper than 8 µm, the Fe mass concentration increases steeply to 88% at 27 µm. As of a depth greater than 27 µm, the Fe mass concentration increases constantly at a low gradient to 90% at 50 µm.

The Cr mass concentration is 81% at a depth of 0 µm before it drops to a value of 78% at a depth of 2 µm. As of a depth of 2 µm, the Cr mass concentration increases to the maximum of 85% at a depth of 3 μm. As of a depth of 3 μm, the Cr mass concentration drops to 75% at a depth of 9 μm. As of a depth of 9 μm, the Cr mass concentration drops steeply to 5% at a depth of 25 μm.

The N mass concentration has a value of 9.8% at 0 μm and drops to a value of 6% at 7.5 μm. The decrease of the mass concentration is not constant; an increase of the N mass concentration to 9.4% is observed at a depth of 2.5 μm. As of a depth of 7.5 μm, the N mass concentration increases steeply to a maximum of 15.6% at 10 μm. At a depth of 12 μm, the N mass concentration drops steeply to 2% at 25 μm. The thickness of the layer therefore amounts to about 12 μm.

The C mass concentration is 2.5% at a depth of 0 μm and increases to 2.6% at 2 μm. As of a depth of 2 μm, the C mass concentration increases steeply to a maximum of 3.75% at 4 μm. As of a depth of 4 μm, the C mass concentration drops steeply to 0.35% at a depth of 15 μm.

An analysis of the progression of the mass concentrations of carbon and nitrogen shows that the mass concentration of nitrogen on the surface of the layer of hard material is greater than the mass concentration of carbon. The ratio is about 4:1.

REFERENCE SYMBOL LIST

1 Release agent
2 Activator
3 Metal
4 Metal nitride
5 Bulk material
6 Layer of hard material
10 Chain
11 Pin
12 Bushing
13 Inner flap
14 Outer flap
M Metal
N Nitrogen

The invention claimed is:

1. A chain component of a chain for power transmission, said chain component comprising:
a substrate based on steel:
a layer of hard material on an outer surface of the substrate based on steel, with the layer of hard material containing metal nitrides and having a C mass concentration which decreases toward an exterior of the layer of hard material, wherein the layer of hard material has an average N mass concentration which is greater than an average C mass concentration in the layer of hard material.

2. The chain component of claim 1, wherein the C mass concentration in the layer of hard material in a region close to the substrate increases in a direction of an inner side of the layer of hard material.

3. The chain component of claim 2, wherein a magnitude of the increase of C mass concentration in the layer of hard material in a region near the substrate is higher than a magnitude of the increase in a region where the C mass concentration decreases.

4. The chain component of claim 1, wherein the C mass concentration in the layer of hard material has a local maximum in the layer of hard material.

5. The chain component of claim 4, wherein a distance of the maximum of the C mass concentration in the layer of hard material from the exterior of the layer of hard material is smaller than a distance of the maximum of the C mass concentration in the layer of hard material from a border between the layer of hard material and the substrate.

6. The chain component of claim 1, wherein the layer of hard material has a N mass concentration which increases in a direction of an outside of the layer of hard material.

7. The chain component of claim 6, wherein the increase of the N mass concentration in the layer of hard material in a region close to the substrate is greater than the increase in a region close to the outside of the layer of hard material.

8. The chain component of claim 1, wherein the average N mass concentration in the layer of hard material is greater by a factor of 2, than the average C mass concentration in the layer of hard material.

9. The chain component of claim 1, wherein an average C mass concentration in every layer deposited in a region near the surface of the layer of hard material is smaller than 20 wt. %, with the region near the surface having a thickness amounting to 80% of an overall thickness of the layer of hard material.

10. The chain component of claim 1, wherein an average Cr mass concentration in the layer of hard material is greater than an average Fe mass concentration in the layer of hard material.

11. The chain component of claim 10, wherein the average Cr mass concentration in the layer of hard material is greater by a factor of 2, than the average Fe mass concentration in the layer of hard material.

12. The chain component of claim 1, wherein the average N mass concentration in the region near the surface of the layer of hard material is greater everywhere than the average C mass concentration in the layer of hard material.

13. The chain component of claim 12, wherein the region near the surface of the layer of hard material has a thickness of 50% of an overall thickness of the layer of hard material.

14. The chain component of claim 1, wherein an average Cr mass concentration in a region near the surface of the layer of hard material is greater everywhere than an average Fe mass concentration in the layer of hard material.

15. The chain component of claim 14, wherein the region near the surface of the layer of hard material has a thickness of 50% of an overall thickness of the layer of hard material.

16. The chain component of claim 1, wherein a N mass concentration at a surface of the layer of hard material is greater than the C mass concentration at an outer surface of the layer of hard material.

* * * * *